United States Patent [19]

Watanabe

[11] Patent Number: 4,811,292
[45] Date of Patent: Mar. 7, 1989

[54] SEMICONDUCTOR MEMORY IN WHICH DATA READOUT OPERATION IS CARRIED OUT OVER WIDE POWER VOLTAGE RANGE

[75] Inventor: Takeshi Watanabe, Tokyo, Japan

[73] Assignee: NEC Corporation, Tokyo, Japan

[21] Appl. No.: 166,743

[22] Filed: Mar. 2, 1988

Related U.S. Application Data

[63] Continuation of Ser. No. 880,964, Jul. 1, 1986, abandoned.

[30] Foreign Application Priority Data

Jul. 1, 1985 [JP] Japan ............................... 60-145030
Jul. 8, 1985 [JP] Japan ............................... 60-150396

[51] Int. Cl.$^4$ .............................................. G11C 11/40
[52] U.S. Cl. .................................... 365/185; 365/189; 365/233; 365/204; 307/578
[58] Field of Search ................ 365/104, 184, 185, 189, 365/203, 204, 226, 229, 230; 307/482, 578

[56] References Cited

U.S. PATENT DOCUMENTS

| | | | |
|---|---|---|---|
| 4,094,012 | 6/1978 | Perlegos et al. | 365/189 |
| 4,503,522 | 3/1985 | Etoh et al. | 365/204 |
| 4,511,811 | 4/1985 | Gupta | 365/184 |

FOREIGN PATENT DOCUMENTS

| | | | |
|---|---|---|---|
| 0079490 | 5/1984 | Japan | 365/104 |
| 0221894 | 12/1984 | Japan | 365/185 |
| 0055728 | 4/1985 | Japan | 307/482 |
| 0085493 | 5/1985 | Japan | 365/203 |

Primary Examiner—Stuart N. Hecker
Assistant Examiner—Glenn A. Gossage
Attorney, Agent, or Firm—Sughrue, Mion, Zinn, Macpeak & Seas

[57] ABSTRACT

A programmable read-only memory is disclosed in which each of the memory cells is composed of a field effect transistor having a floating gate. The memory is equipped with a word line pull-up circuit which includes a pulse generator generating a pulse signal in response to a change in address signals and a capacitor coupled between the output terminal of the pulse generator and a selected word line, thereby the selected word line taking a level larger than a power supply voltage.

7 Claims, 6 Drawing Sheets

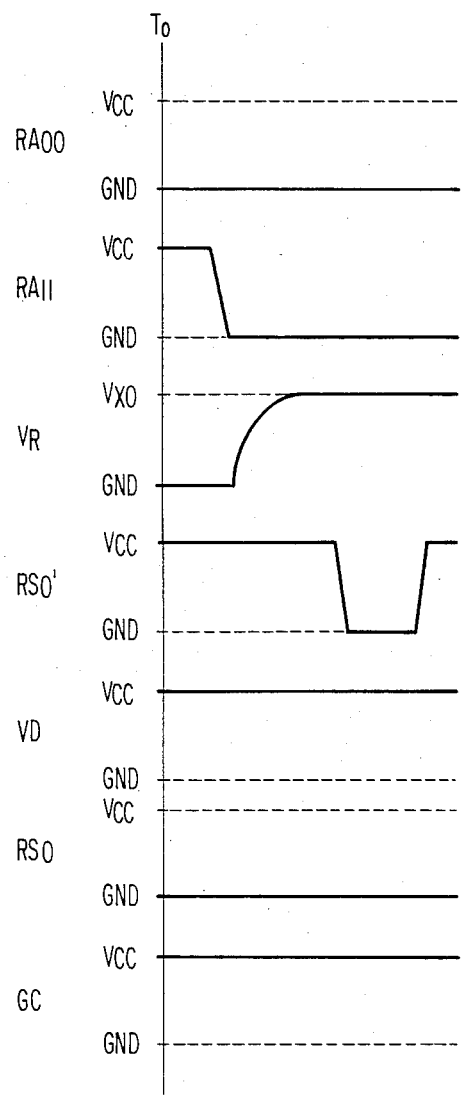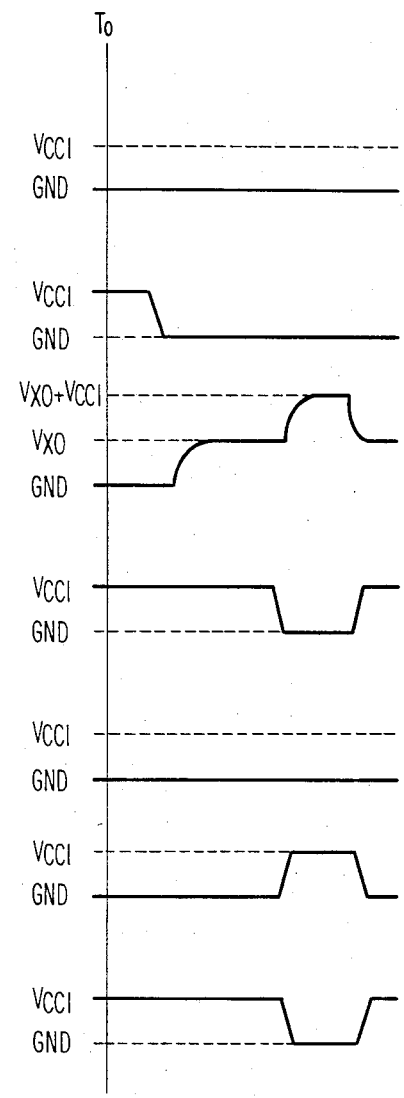
FIG 5A  FIG 5B

1

SEMICONDUCTOR MEMORY IN WHICH DATA READOUT OPERATION IS CARRIED OUT OVER WIDE POWER VOLTAGE RANGE

This is a continuation of application Ser. No. 880,964, filed July 1, 1986, now abandoned.

BACKGROUND OF THE INVENTION

The present invention relates to a semiconductor memory and, more particularly, to a driving of word lines in a programmable read-only memory (referred hereinafter to as a "PROM") having memory cells each constituted with a field effect transistor having a floating gate.

In such a PROM, a data readout operation is performed by using a difference in threshold voltage between a programmed memory cell and a non-programmed memory cell. The floating gate of the programmed memory cell is charged negative or positive due to electrons or holes injected therein, and therefore, the threshold value thereof takes a high value $V_{TMW}$. On the other hand, since the floating gate of the non-programmed memory cell is not charged, its threshold value takes a low value $V_{TMO}$. Each memory cell is applied with a voltage between $V_{TMW}$ and $V_{TMO}$ as a readout voltage. Therefore, the non-programmed memory cell is turned on while the programmed memory cell is kept non-conductive. Thus, output data is obtained as "1" or "0" dependent upon whether or not the selected memory cell is programmed.

The readout voltage is reduced by a drop of a power supply voltage. When the readout voltage becomes smaller than the low threshold voltage $V_{TMO}$ due to the drop of the power voltage, all of the memory cells are kept non-conductive regardless of whether or not they are programmed. The low threshold value $V_{TMO}$ of an N-channel non-programmed memory cell is about 2.5 V, and a readout voltage of at least 3 V is required in order to make the memory cell conductive realiably. Therefore, when the readout voltage is lowered below 3 V due to the power voltage drop, the data readout operation of the EPROM becomes impossible.

SUMMARY OF THE INVENTION

Therefore, an object of the present invention is to provide a semiconductor memory in which a data readout operation is performed over an expanded power voltage range.

According to one aspect of the present invention, there is provided a semiconductor memory comprising means responsive to a set of address signals for selecting a word line, a capacitive element having one end connected to the word line, and means for supplying a voltage higher than a non-selection level of the world line to the other end of the capacitive element after the word line is selected.

The capacitive element is first charged up to the selection level of the word line. Thereafter, the voltage higher than the non-selection level is applied to the other end of the capacitive element. As a result, the potential on the selected word line is raised by the bootstrap effect of the capacitive element. In other words, a voltage which is higher than the prior art readout voltage is applied to the selected memory cell as an actual readout voltage. Thus, the readout operation is performed even when the power source voltage drops.

A semiconductor memory according to another aspect of the present invention comprises a plurality of memory cells each constituted with a field effect transistor having a floating gate, and means for increasing the potential of a selected word line above a power voltage by using a delayed signal of an address signal change.

Thus, a non-programmed memory cell is made conductive by the potential on the selected word line even when the power voltage drops to a value around the low threshold value.

BRIEF DESCRIPTION OF THE DRAWINGS

The above and other objects, advantages and features of the present invention will be more apparent from the following description taken in conjunction with the accompanying drawings, in which

FIGS. 5A and 5B are timing charts representing a circuit operation of FIG. 4 when a power voltage is above a predetermined level and when it is below the predetermined level, respectively.

DETAILED DESCRIPTION OF THE PREFERRED EMBODIMENTS

Figure 1:
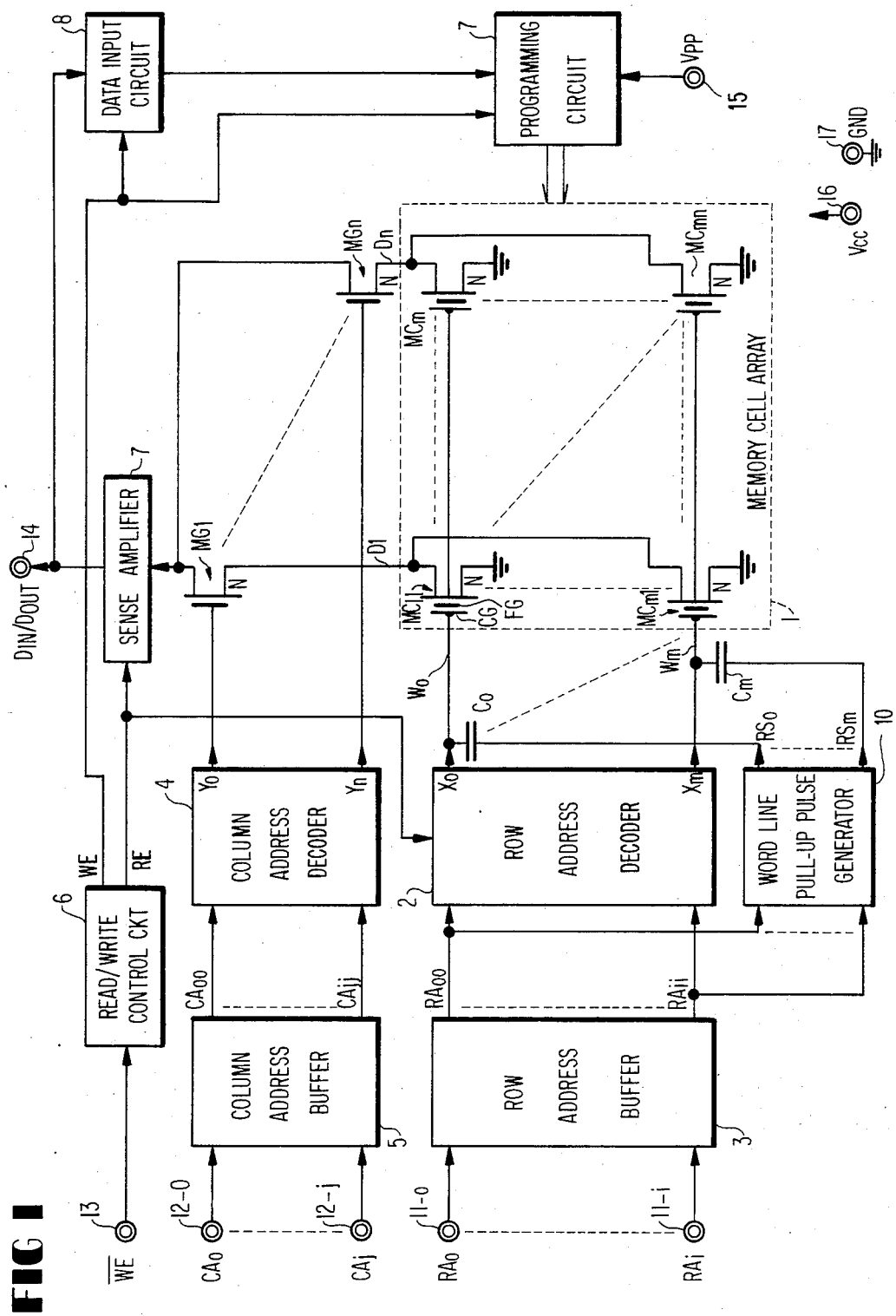
FIG. 1 is a block diagram of a semiconductor memory according to an embodiment of the present invention.

FIG. 1 shows a block diagram of a PROM according to an embodiment of the present invention. In FIG. 1, a plurality of memory cells $MC_{11}$ to $MC_{mn}$ are arranged in n lines and m rows to constitute a memory cell array 1. Each memory cell is constituted by an N channel field effect transistor having a control gate CG, a floating gate FG and a source-drain current path. The control gate CG of each memory cell is connected to one of word lines $W_o$ to $W_m$ and the source-drain path thereof is connected between one of digit lines $D_1$ to $D_n$ and a ground point. Between the digit lines $D_1$ to $D_n$ and a sense amplifier 7, N channel gate transistors $MG_1$ to $MG_n$ are connected, respectively.

Row address signals $RA_o$ to $RA_i$ are supplied through row address terminals 11-0 to 11-i to a row address buffer 3. Signals $RA_{oo}$ to $RA_{ii}$ from the buffer 3 are supplied to a row address decoder 2. The decoder 2 thereby changes one of selection signals $X_o$ to $X_m$ to a selection level and energizes an associated word line W. Column address signals $CA_o$ to $CA_j$ are supplied via column address terminals 12-o to 12-j to a column address buffer 5. A column address decoder 4 responds to the outputs $CA_{oo}$ to $CA_{jj}$ of the buffer 5 and raises one of decoded signals $Y_o$ to $Y_n$ to the high level, so that an associated gate transistor MG is turned on. As a result, one memory cell MC is selected.

A signal $\overline{WE}$ supplied to a terminal 13 is used to bring the PROM into a data readout operation or a data programming operation. When the signal $\overline{WE}$ takes the high level, a read/write control circuit 6 changes a read-enable signal RE to the high level and a write-enable signal WE to the low level. Therefore, the sense amplifier 7 is activated to amplify data stored in the selected memory cell and provides the amplified data at a terminal 14 as output data Dout. When the signal $\overline{WE}$ is in the low level, the write-enable signal WE becomes the high level and a data programming operation is performed. At this time, a programming voltage Vpp is supplied to a terminal 15. A programming circuit 9 responds to an output produced by a data input circuit 8 according to an input data $D_{IN}$ supplied to the terminal 14 and controls whether or not the programming voltage Vpp is applied to the selected word line W and the selected digit line D. When the selected memory cell is supplied with the voltage Vpp at its control gate CG and across its source-drain path, electrons are injected into its floating gate FG. The gate FG is thereby charged negative. As a result, the threshold value thereof becomes high, and a programmed memory cell is thus formed.

Figure 6:
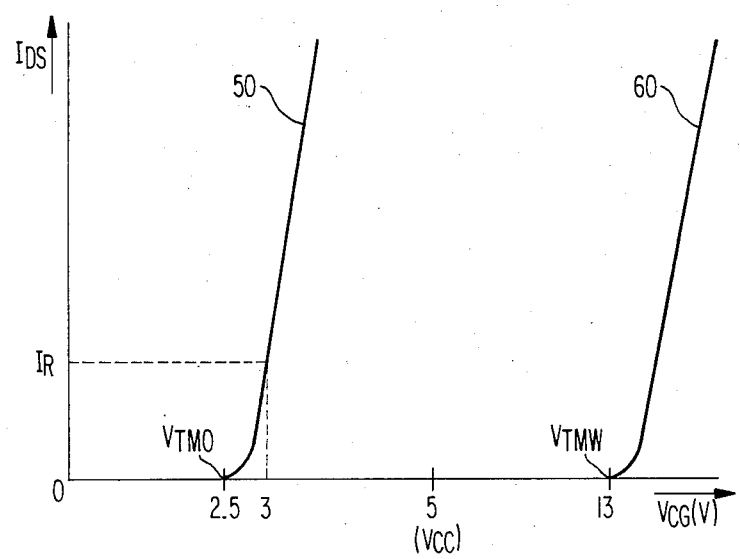
FIG. 6 shows control gate voltage $V_{CG}$ versus drain current $I_{DS}$ characteristic curves of a non-programmed memory cell and a programmed memory cell, respectively.

FIG. 6 shows control gate voltage $V_{CG}$ versus drain-source current $I_{DS}$ characteristics curves 60 and 50 of a programmed memory cell and a non-programmed memory cell, respectively. In the non-programmed memory cell, the floating gate thereof is not charged negative. Therefore, its threshold value $V_{TMO}$ is about 2.5 V and it is turned on by a control gate voltage $V_{CG}$ exceeding the threshold value, so that a drain current $I_{DS}$ increases. On the other hand, the programmed memory cell has a threshold value $V_{TMW}$ of about 13 V since its floating gate is charged negative. Therefore, the programmed memory cell is not turned on so long as its control gate voltage $V_{CG}$ does not exceed the threshold value $V_{TMW}$. In the data readout operation, an intermediate voltage between the threshold values $V_{TMO}$ and $V_{TMW}$ is thus applied to the control gate CG of the selected memory cell MC as a readout voltage. In other words, the row address decoder 2 responds to the row address signals RAo to RAi and changes one of the selection signals Xo to Xm to this intermediate voltage to energize the associated word line W. The power voltage $V_{cc}$ applied to a power supply terminal 16 is 5 V, and thus used as that intermediate voltage, advantageously.

PROMs have been employed in various equipments powered by batteries. Electromotive force of a battery reduces with its use. This means that the readout voltage to be supplied to the memory cell drops gradually. The threshold value $V_{TMO}$ of the non-programmed memory cell is about 2.5 V, but a control gate voltage $V_{CG}$ of at least 3 V is required in order that the non-programmed memory cell produces a readout current $I_D$. When the readout voltage (i.e., control gate voltage $V_{CG}$) becomes lower than 3 V due to the drop in the power voltage $V_{CC}$, the sense amplifier will judge the non-programmed memory cell as a programmed memory cell. That is, the data readout operation becomes impossible.

In order to broaden the range of the power voltage $V_{CC}$ within which the data readout operation can be performed, the PROM shown in FIG. 1 further includes a signal generator 10 generating word line pull-up signals RSo to RSm in response to a potential change in the outputs RAoo to RAii of the row address buffer 3 (i.e., potential change in the row address signals RAo to RAi), and capacitors Co to Cm connected, respectively, between output terminals of the signal generator 10 and the word lines Wo to Wm. The pull-up signals RSo to RSm are generated after the row address decoder 2 raises the selected signal X to the selection level. Therefore, the capacitor C connected to the energized word line is first charged to the selection level and thereafter supplied with the pull-up signal RS. Accordingly, the word line W is further charged up to a level of a sum of the selection level of the signal X and the signal level of the signal RS. As a result, the non-programmed memory cell receives at its control gate a voltage $V_{CG}$ that is enough to produce the readout current $I_R$ even when the power voltage $V_{CC}$ drops below 3 V (FIG. 6).

Figure 2:
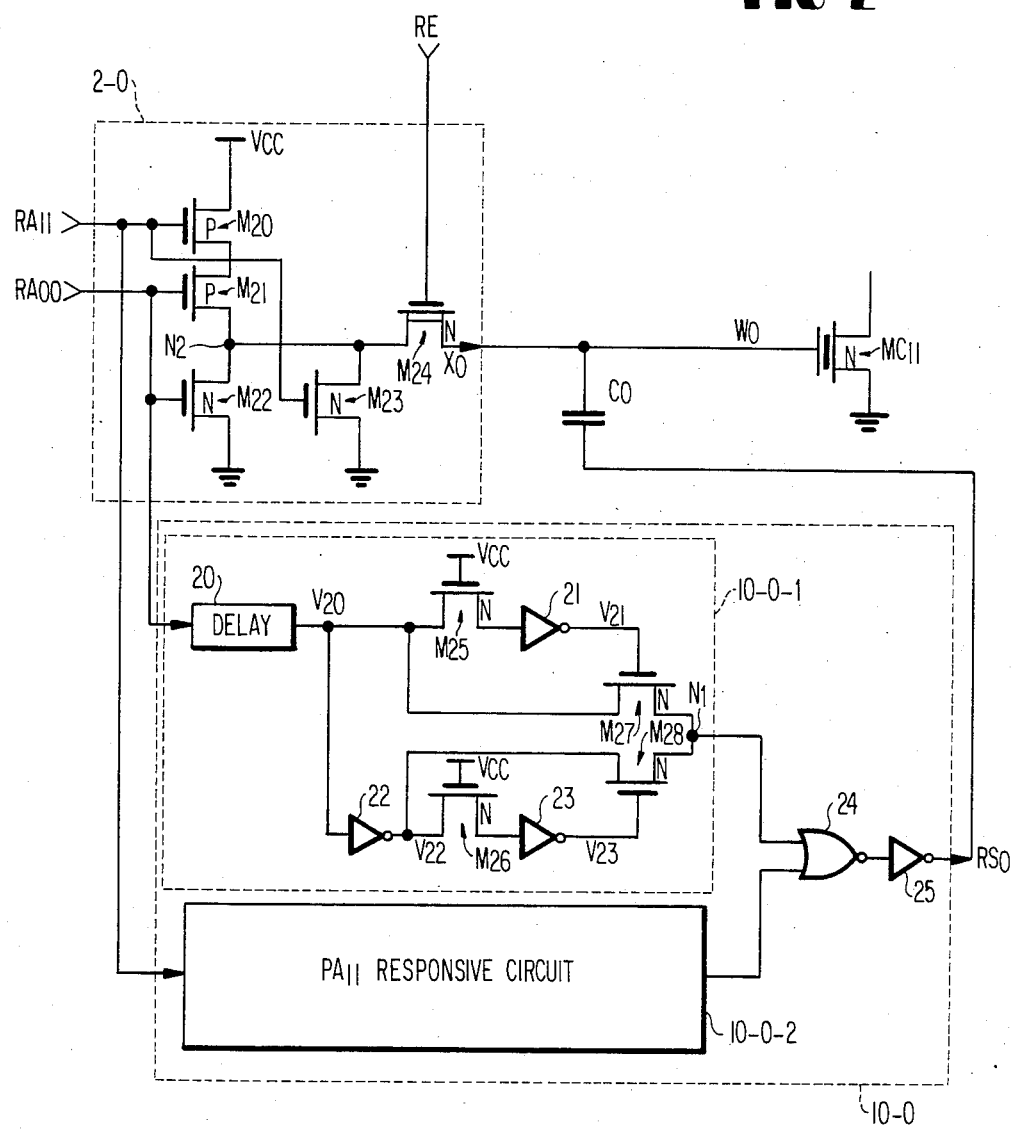
FIG. 2 is a circuit diagram showing one portion of the memory shown in FIG. 1.

FIG. 2 is a circuit diagram of a row address decoder 2-0 and a word line pull-up signal generator 10-0 both associated with the word line Wo. The decoder 2-0 includes P-channel transistors $M_{20}$ and $M_{21}$ and N-channel transistors $M_{22}$ and $M_{23}$, these transistors constituting a NOR circuit having 2 inputs to which the signals $RA_{00}$ and $RA_{11}$ are supplied from the address buffer 3. When both of the signals $RA_{00}$ and $RA_{11}$ are in the low level, an output of the NOR circuit becomes the high level. The output of the NOR circuit is supplied through an N-channel depletion type transistor $M_{24}$ to the word line Wo as a selection signal Xo. The read-enable signal RE is supplied to the gate of the transistor $M_{24}$. The signal generator 10-0 generating the word line pull-up signal RSo includes an $RA_{00}$ responsive circuit 10-0-1 and an $RA_{11}$ responsive circuit 10-0-2. Since these responsive circuits have the same construction, only the circuit 10-0-1 is shown in detail in FIG. 2. In the circuit 10-0-1, the signal $RA_{00}$ is delayed by a delay circuit 20 to provide a delayed signal $V_{20}$. The delay circuit 20 may be constructed with a plurality of inverters connected in series. The signal $V_{20}$ is supplied through an N-channel transistor $M_{25}$ having a gate supplied with the power voltage $V_{CC}$ to an inverter 21. The signal 20 is further supplied to an inverter 22. An inverted, signal $V_{22}$ from the inverter 22 is supplied through an N-channel transistor $M_{26}$ having a gate supplied with the power voltage $V_{CC}$ to an inverter 23. The outputs $V_{21}$ and $V_{23}$ of the inverters 21 and 23 are supplied to gates of N-channel transistors $M_{27}$ and $M_{28}$, respectively. Source-drain current paths of the transistors $M_{27}$ and $M_{28}$ are connected between the output terminal of the delay circuit 20 and a node $N_1$ and between the output terminal of the inverter 22 and the node $N_1$, respectively. A signal appearing at the node $N_1$ is derived as an output of the circuit 10-0-1 and, together with an output of the $RA_{11}$ responsive circuit 10-0-2, supplied to a NOR circuit 24. An output of the NOR circuit 24 is supplied to an inverter 25 whose output is derived as the pull-up signal RSo of the generator 10-0. A capacitor Co is connected between the output terminal of the signal generator 10-0 and the word line Wo.

Figure 3:
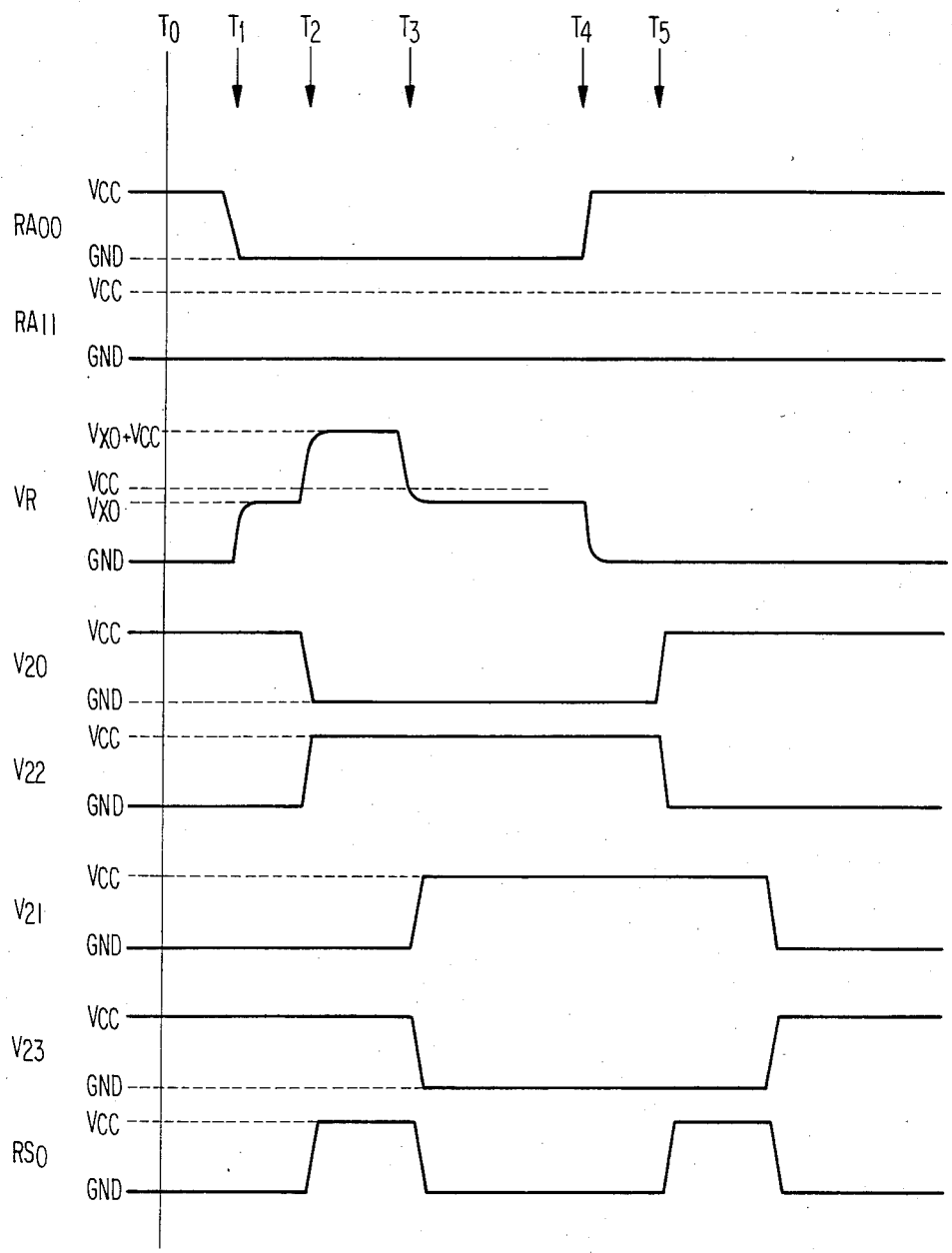
FIG. 3 is a timing chart of an operation of the circuit shown in FIG. 2.

FIG. 3 shows a timing chart representative of the circuit operation. Before a time point $T_1$, the row address decoder 2 does not energize the word line Wo and does another word line. Therefore, the signals $RA_{00}$ and $RA_{11}$ take the high level and the low level, respectively, for example. At the time point $T_1$, at least one of the row address signals RAo to RAi changes its potential, resulting in that the signal $RA_{oo}$ from the address buffer 3 changes from the high level to the low level. On the other hand, the signal $RA_{11}$ is kept at the low level according to the previous address information. Consequently, the transistors $M_{20}$ and $M_{21}$ are turned on and the transistors $M_{22}$ and $M_{23}$ are turned off. The potential at a node $N_2$ is thus raised to the power voltage $V_{cc}$ (high level). The selection signal Xo takes the selection level and the word line Wo is energized to be charged. The potential VR of the word line Wo takes a $V_{xo}$ level. The level $V_{xo}$ is slightly lower than the power voltage $V_{CC}$ as shown in FIG. 3 due to the existence of the transistor $M_{24}$. The level change of the signal $RA_{00}$ is supplied to the circuit 10-0-1 and delayed by the delay circuit 20. The delayed output $V_{20}$ of the delay circuit 20 is changed to the low level at a time point $T_2$. The delay time of the circuit 20 is selected to be longer than a time required for charging the word line Wo to the level $V_{xo}$. At the time point $T_2$, the output signal $V_{22}$ of the inverter 22 is changed to the high level. The transistor 26 acts as a delay element. Therefore, the gate of the transistor $M_{28}$ is in the high level at the time point $T_2$. The node $N_1$ is thereby changed to the high level. The output of the inverter 25 (therefore, the signal RSo) takes the power voltage $V_{CC}$ (high level). Since the capacitor Co is charged to the level $V_{xo}$ for a time period from the time point $T_1$ to the time point $T_2$, the potential VR of the word line Wo is pulled up by the high level signal RSo supplied to the capacitor Co and thus takes a $(V_{xo}+V_{CC})$ level as shown in FIG. 3. This potential level is supplied to the control gates CG of the memory cells MCl1 to MCln (FIG. 1) as a readout voltage. Assuming that the column address decoder 4 turns the gate transistor MG1 on in response to the column address signals CAo to CAj, a memory cell MCl1 is selected. Further assuming that the memory cell MCl1 is a non-programmed cell, this cell is turned on to produce the readout current $I_D$. As a result, the sense amplifier 7 produces output data Dout of "0", for example. If the cell $MC_{l1}$ is programmed, its threshold value $V_{TMW}$ is about 13 V. On the other hand, the readout voltage level $(V_{xo}+V_{CC})$ is lower than 10 V. Therefore, the cell $MC_{l1}$ is maintained in the non-conductive state and the sense amplifier 7 produces output data Dout of "1". The N-channel depletion transistor $M_{24}$ has a negative threshold value. The node $N_2$ to which one of the drain and source of the transistor $M_{24}$ is connected takes the power voltage $V_{CC}$, and the word line Wo to which the other of them is connected takes the $(V_{xo}+V_{CC})$ level. As a result, the back gate biasing-effect occurs to shift the threshold value of the transistor $M_{24}$ to a positive value. In the data readout operation, the signal RE, i.e. the gate of the transistor $M_{24}$, takes the power voltage $V_{CC}$ (high level), and the source and drain thereof take a potential that is equal to or higher than the gate potential. Therefore, the transistor $M_{24}$ is turned off when the potential of the word line Wo exceeds the power voltage $V_{CC}$. The word line Wo and the decoder circuit 2-0 are thereby separated from each other.

Due to the delay effects of the transistors $M_{25}$ and $M_{26}$, the outputs $V_{21}$ and $V_{23}$ of the inverters 21 and 23 are inverted respectively to the high level and the low level at a time point $T_3$. Transistors $M_{27}$ and $M_{28}$ are thereby turned on and off, respectively. The signal $V_{20}$ is in the low level at the time point $T_3$. Therefore, the node $N_1$ is discharged to the low level and the signal RSo is inverted to the low level. The potential VR of the word line Wo is thereby discharged to the $V_{xo}$ level. As a result, the data readout operation responsive to the change in the address signals is completed.

The readout voltage which is actually supplied to the selected memory cell MC takes the level which is approximately as high as twice the power voltage $V_{CC}$. Therefore, the non-programmed cell receives the control gate voltage $V_{CG}$ which is required for obtaining the readout current $I_D$ even when the power voltage $V_{CC}$ is lowered to about 1.5 V. Thus, the range of the power voltage within which the data readout operation is carried out is expanded in the PROM shown in FIGS. 1 and 2.

When the signal $RA_{00}$ is changed to the high level in response to a change in the row address signals to select another memory cell, the transistors $M_{20}$ and $M_{23}$ are turned off and on, respectively, so that the word line Wo is discharged to the ground level (low level). The signal generator 10-0 responds to the change in the address signals and produces again the high level pull-up signal RSo at a time point $T_5$, but at this time, the transistor $M_{23}$ clamps the word line Wo at the ground level. Therefore, a substantial level increase does not occure on the word line Wo. The readout voltage taking the $(V_{xo}+V_{CC})$ level is supplied to a newly selected memory cell by the operations of the signal generator 10 and other capacitors C shown in FIG. 1.

Figure 4:
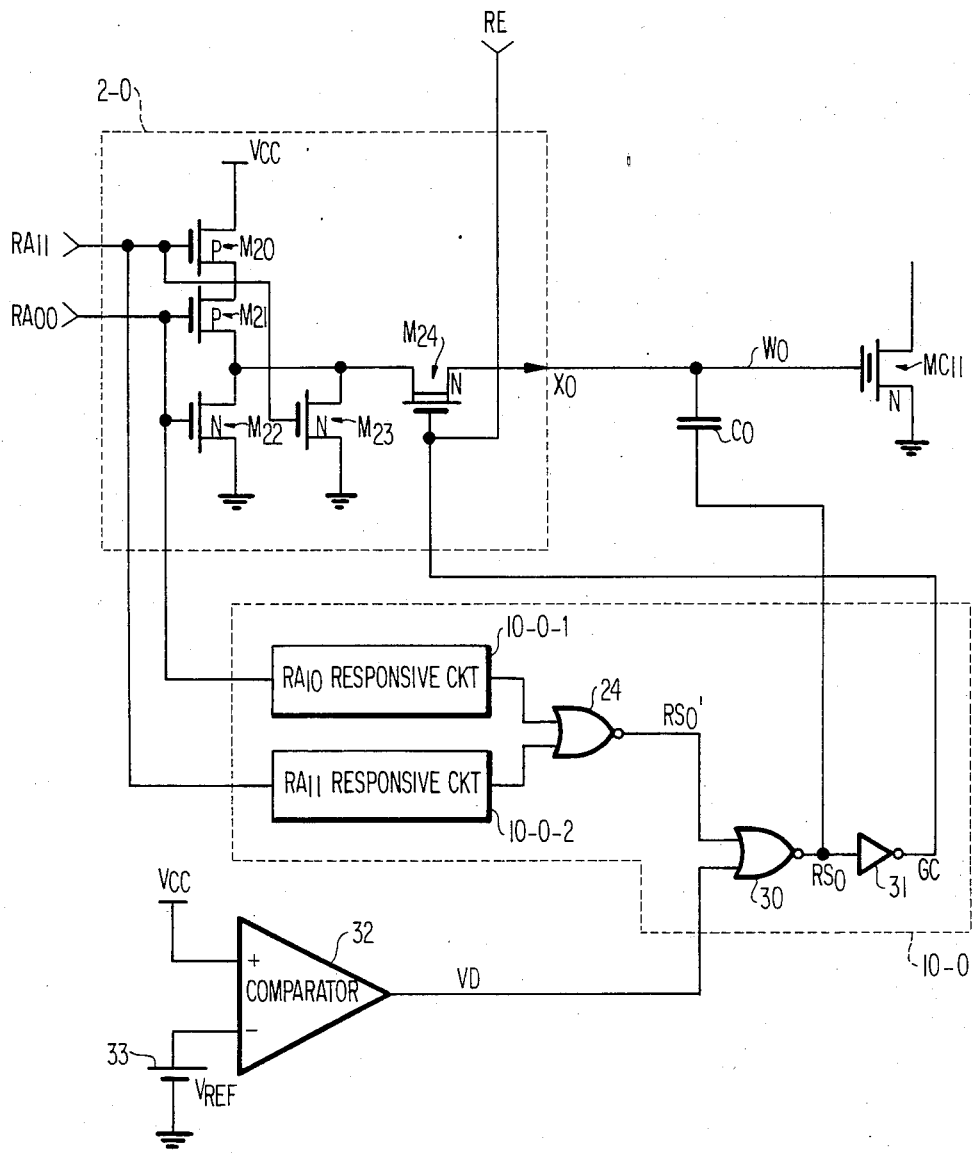
FIG. 4 is a circuit diagram showing one portion of another embodiment of the present invention.

FIG. 4 shows another embodiment of the present invention, in which only portions corresponding to those shown in FIG. 2 are shown. The same constituents as those shown in FIG. 2 are depicted by the same reference numerals and symbols to omit their further description. Features of this embodiment are that, a readout voltage $V_R$ higher than $V_{CC}$ is applied to a selected memory cell only when the source voltage $V_{CC}$ is lower than a predetermined value, and that means is provided for reliably separating the row decoder circuit from the boosted word line. A comparator 32 is used to detect the power voltage $V_{CC}$. The non-inverted input terminal(+) of the comparator 32 is supplied with the power voltage $V_{CC}$ and the inverted input terminal(−) thereof is supplied with a reference voltage Vref from a reference voltage source 33. The reference voltage Vref is selected to be a voltage value by which the non-programmed memory cell produces the readout current $I_R$, i.e., 3 V (refer to FIG. 6). The output $V_D$ of the comparator 32 is supplied to one input terminal of a NOR circuit 30 which has the other input terminal supplied with an output RSo' of a NOR circuit 24. The output of the NOR circuit 30 is supplied to the capacitor Co as the pull-up signal RSo and further to an inverter 31. The output of the inverter 31 is supplied to the gate of a transistor $M_{24}$ as a gate control signal GC.

When the power voltage $V_{CC}$ is higher than the reference voltage Vref, that is, when the readout current $I_D$ is obtained by applying a readout voltage taking the power voltage $V_{CC}$ level to a non-programmed memory cell, the output $V_D$ of the comparator 32 takes the high level, as shown in FIG. 5A. Therefore, the signal RSo is clamped to the low level regardless of the level change in the signal $RA_{00}$ or RAll caused by the change in the address signals. The signal GC takes therefore the high level. Consequently, the voltage $V_R$ of the word line Wo takes the Vxo level and is supplied to the memory cell $MC_{l1}$ as a readout voltage.

When the source voltage $V_{CC}$ is reduced to a level $V_{CCl}$ that is lower than the reference voltage Vref, the comparator 32 produces a low level output $V_D$ as shown in FIG. 5B. When the signal RAll is changed to the low level due to the change in the address signal (the signal $RA_{00}$ is in low level), the transistors $M_{20}$ and $M_{21}$ are turned on to charge the word line Wo to the Vxo level. As described with reference to FIG. 2, the output RSo' of the NOR circuit 24 is inverted to the low level and the signal RSo is inverted to the high level after the capacitor Co is charged to the Vox level. As a result, the word line is further charged, so that its potential $V_R$ takes the $(V_{xo}+V_{CCl})$ level. Since the signal RSo is in high level, the signal GC, i.e. the gate of the transistor $M_{24}$, takes the low level. Thus, the gate of the transistor $M_{24}$ takes the low level while both of the source and drain thereof take the level higher than the gate level. Therefore, the transistor $M_{24}$ is ensured to be in the non-conductive state even if the threshold value thereof has deviated from a designed value. The decoder circuit 2-0 is thereby separated completely from the word line Wo. When the signal RSo is inverted to the low level, the potential $V_R$ of the word line is decreased to the Vxo level.

The range of the source voltage within which the data readout operation is carried out is also expanded in this embodiment. Furthermore, since the bootstrap effect of the word line potential is performed only when the power voltage is lowered, the problem that the programmed memory cell may be turned on when the power voltage $V_{CC}$ is increased, is resolved, which may otherwise occur in the memory shown in FIGS. 1 and 2. The transistor $M_{24}$ shown in FIG. 2 can be supplied at its gate with the low level at the boosting time of the word line in accordance with the teaching of FIG. 4.

It should be apparent that the present invention is not limited to the above embodiments, but may be modified and changed without departing from the scope and spirit of the invention. For instance, the signal generators 10-0-1 and 10-0-2 shown in FIGS. 2 and 4 may respond only to a change in the signals RAoo and RAll from the high level to the low level and produce the high level signal. Although the respective embodiments described hereinbefore are constituted with complementary insulated-gate field effect transistors, they may be constituted only with N channel transistors or P channel transistors.

What is claimed is:

1. A semiconductor memory comprising a plurality of memory transistors each having a floating gate and a control gate, a decoder circuit having a plurality of output ends, a plurality of word lines each connected between a respective one of said output ends of said decoder circuit and the control gate of an associated memory transistor, an address buffer circuit receiving a plurality of address signals and outputting a set of buffered address signals which are applied to said decoder circuit, a word line pull-up pulse generator coupled between said address buffer circuit and said plurality of word lines, a power supply terminal connected to said decoder circuit and said word line pull-up pulse generator for supplying a power voltage thereto, said decoder circuit supplying, in response to said set of buffered address signals applied thereto, a selection voltage near said power voltage, but less than said power voltage, to a selected one of said word lines and a reference voltage to the others of said word lines, said word line pull-up pulse generator including a delay means and a one-shot pulse generating means and outputting, in response to a change in address signals, a one-shot pulse of a voltage near said power voltage after a delay of time from said change in the address signals and after said selection voltage is supplied from said decoder circuit to the selected one of said word lines, a plurality of capacitors connected between said word lines and said word line pull-up pulse generator to transmit the outputted one-shot pulse to the selected one of said word lines to thereby pull up the voltage level of the selected one of said word lines to a level higher than said power voltage.

2. The semiconductor memory as claimed in claim 1 wherein said decoder circuit includes a plurality of NOR gates coupled to said output ends and a plurality of transfer transistors respectively coupled between said NOR gates and associated ones of said output ends, each of said transfer transistors receiving at its gate a voltage near said power voltage in response to a read enable signal and preventing electrical connection between the associated NOR gate and the associated word line when the associated word line takes the pulled up level greater than said power voltage.

3. A semiconductor memory comprising a first terminal supplied with a power voltage, a second terminal supplied with a reference voltage, a plurality of word lines, a plurality of digit lines, a plurality of memory transistors each having a floating gate, a control gate connected to an associated one of said word lines and a source-drain path connected between an associated one of said digit lines and said second terminal, a node, a plurality of gate transistors each connected between said node and an associated one of said digit lines, decoder means responsive to address signals for turning one of said gate transistors ON to select the associated one of said digit lines and for selecting one of said word lines to charge a selected word line to a first level near said power voltage a plurality of capacitors each having a first end connected to an associated one of said word lines and a second end, means for delaying address signals to produce delayed address signals after said selected word line is charged to said first level means responsive to at least one of said delayed address signals for generating a one-shot pulse, said one-shot pulse being terminated before said address signals are changed to other address signals, means coupled between said generating means and said second end of each of said capacitors for supplying said one-shot pulse to said second end of the capacitor having said first end connected to said selected word line and means coupled to said node for sensing a potential at said node to produce output data representative of data stored in the memory transistor having the control gate connected to said selected word line and the source-drain path connected between said selected digit line and said second terminal, whereby said selected word line is changed in a data read operation from said first level to a second level above said power voltage and returned to said first level before said other address signals are supplied.

4. The semiconductor memory as claimed in claim 3, further comprising means for producing a read-enable signal in said data read operation, and further including a plurality of control transistors each having a gate supplied with said read-enable signal and a source-drain path connected between said decoder means and an associated one of said word lines, said second level on said selected word line turning the associated one of said control transistors OFF.

5. A semiconductor memory comprising a first terminal supplied with a power voltage, a plurality of word lines, a plurality of memory transistors each having a floating gate and a control gate connected to an associated one of said word lines, means coupled to said first terminal for detecting that said power voltage is lowered to a level less than a predetermined value to produce a detection output, decoder means responsive to first address information for selecting one of said word lines to supply the selected word line with a voltage of a first level near said power voltage, means responsive to said first address information for generating a pull-up signal only when said detecting means produces said detection output, said pull-up signal being generated after said selected word line is supplied with a voltage of said first level and taking a level near said power voltage, a plurality of capacitors respectively connected between said generating means and said word lines, the capacitor connected to the selected word line receiving said pull-up signal to bring the level of said selected word line to a voltage higher than said power voltage only when said power voltage is smaller than said predetermined value.

6. The semiconductor memory as claimed in claim 5 wherein said decoder means has a plurality of NOR gates and a plurality of coupling transistors connected between said word lines and associated ones of said NOR gates to disconnect the selected word line from the associated NOR gate when the level of said selected word line is brought to the voltage higher than said power voltage.

7. The semiconductor memory as claimed in claim 6, further comprising inverter means coupled between said generating means and gates of said coupling transistors to apply an inverted signal of said pull-up signal to the gates of said coupling transistors connected to non-selected word lines.

* * * * *

UNITED STATES PATENT AND TRADEMARK OFFICE
CERTIFICATE OF CORRECTION

PATENT NO. : 4,811,292

DATED : March 7, 1989

INVENTOR(S) : TAKESHI WATANABE

It is certified that error appears in the above-identified patent and that said Letters Patent is hereby corrected as shown below:

Col. 2, line 40, delete "n lines and m rows" and insert --$\underline{n}$ lines and $\underline{m}$ rows--.

Col. 6, line 15, delete "occure" and insert --occur--.

Signed and Sealed this

Twenty-eighth Day of November 1989

*Attest:*

JEFFREY M. SAMUELS

*Attesting Officer*     *Acting Commissioner of Patents and Trademarks*